(12) United States Patent
Zerbe et al.

(10) Patent No.: US 9,735,792 B2
(45) Date of Patent: Aug. 15, 2017

(54) INTEGRATED CIRCUIT COMPRISING CIRCUITRY TO DETERMINE SETTINGS FOR AN INJECTION-LOCKED OSCILLATOR

(71) Applicant: Rambus Inc., Sunnyvale, CA (US)

(72) Inventors: Jared L. Zerbe, Woodside, CA (US); Masum Hossain, Sunnyvale, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

(21) Appl. No.: 14/651,571

(22) PCT Filed: Jan. 3, 2014

(86) PCT No.: PCT/US2014/010204
§ 371 (c)(1),
(2) Date: Jun. 11, 2015

(87) PCT Pub. No.: WO2014/109964
PCT Pub. Date: Jul. 17, 2014

(65) Prior Publication Data
US 2015/0333760 A1    Nov. 19, 2015

Related U.S. Application Data

(60) Provisional application No. 61/750,232, filed on Jan. 8, 2013.

(51) Int. Cl.
*H03B 19/12* (2006.01)
*H03L 7/24* (2006.01)
(Continued)

(52) U.S. Cl.
CPC ............. *H03L 7/24* (2013.01); *H03K 3/0315* (2013.01); *H03L 1/00* (2013.01); *H03L 7/06* (2013.01); *H03K 3/0307* (2013.01)

(58) Field of Classification Search
CPC ........ H03B 19/12; H03K 3/0315; H03L 7/06; H03L 1/00; H03L 7/24
(Continued)

(56) References Cited

U.S. PATENT DOCUMENTS 5,122,677 A    6/1992 Sato
5,142,247 A    8/1992 Lada, Jr. et al.
(Continued)

OTHER PUBLICATIONS

Adler, Robert, "A Study of Locking Phenomena in Oscillators," Jun. 1946, Proceedings of the I.R.E. and Waves and Electrons, pp. 351-357. 7 pages.
(Continued)

*Primary Examiner* — Arnold Kinkead
(74) *Attorney, Agent, or Firm* — Park, Vaughan, Fleming & Dowler LLP; Laxman Sahasrabuddhe

(57) ABSTRACT

Embodiments of an integrated circuit (IC) comprising circuitry to determine settings for an injection-locked oscillator (ILO) are described. In some embodiments, an injection signal is generated based on a first clock edge of a reference clock signal, and is injected into an ILO. Next, one or more output signals of the ILO are sampled based on a second clock edge of the reference clock signal, and settings for the ILO are determined based on the samples. In some embodiments, a sequence of two or more time-to-digital (TDC) codes is generated based on a reference clock signal and a free-running ILO. In some embodiments, the TDC circuitry that is already present in a delay-locked loop is reused for determining the sequence of two or more TDC codes. The ILO settings can then be determined based on the sequence of two or more TDC codes.

14 Claims, 7 Drawing Sheets

(51) Int. Cl.
H03L 1/00 (2006.01)
H03L 7/06 (2006.01)
H03K 3/03 (2006.01)

(58) Field of Classification Search
USPC ...... 331/46, 47, 57, 50, 51, 55, 74; 327/115, 327/116, 117, 156
See application file for complete search history.

(56) References Cited

U.S. PATENT DOCUMENTS

| | | | |
|---|---|---|---|
| 6,466,073 | B1 | 10/2002 | Yukinari et al. |
| 6,961,862 | B2 | 11/2005 | Best et al. |
| 7,940,830 | B2 | 5/2011 | Marsili et al. |
| 7,948,812 | B2 | 5/2011 | Ware |
| 7,952,438 | B2 | 5/2011 | Song et al. |
| 8,643,409 | B2 | 2/2014 | Lu et al. |
| 8,941,420 | B2* | 1/2015 | Zerbe ............ H03L 7/06 327/116 |
| 2005/0265437 | A1 | 12/2005 | Yeung et al. |
| 2009/0088113 | A1 | 4/2009 | Marsili et al. |
| 2009/0167441 | A1 | 7/2009 | Song et al. |
| 2009/0175116 | A1 | 7/2009 | Song et al. |
| 2010/0182056 | A1 | 7/2010 | Liang et al. |
| 2013/0002318 | A1 | 1/2013 | Lu et al. |
| 2014/0043105 | A1* | 2/2014 | Zerbe ............ H03K 3/0322 331/50 |

OTHER PUBLICATIONS

Carusone, Tony Chan, "Injection-Locking for High-Speed Wireline Communication," University of Toronto, Apr. 15, 2010. 14 pages.
Casper et al., "A 20Gb/s Forwarded Clock Transceiver in 90nm CMOS," 4.6, ISSCC 2006 Session 4. 10 pages.
Farjad-Rad et al., "A 33-mW 8-Gb/s CMOS Clock Multiplier and CDR for Highly Integrated I/Os," IEEE Journal of Solid-State Circuits, vol. 39, No. 9, Sep. 2004, pp. 1553-1561. 9 pages.
Hossain et al., "5-10 Gb/s 70 mW Burst Mode AC Coupled Receiver in 90-nm CMOS," IEEE Journal of Solid-State Circuits, vol. 45, No. 3, Mar. 2010, pp. 524-537. 14 pages.
Hossain et al., "A 6.8mW 7.4Gb/s Clock-Forwarded Receiver with up to 300MHz Jitter Tracking in 65nm CMOS," ISSCC 2010, Session 8, High-Speed Wireline Transceivers 8.2, pp. 158-160. 3 pages.
Hossain et al., "CMOS Oscillators for Clock Distribution and Injection-Locked Deskew," IEEE Journal of Solid-State Circuits, vol. 44, No. 8, pp. 2138-2153, Aug. 2009. 16 pages.
Hu et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.
Hu et al., "A 0.6mW/Gbps, 6.4-8.0Gbps Serial Link Receiver Using Local Injection-Locked Ring Oscillators in 90nm CMOS," 2009 Symposium on VLSI Circuits Digest of Technical Papers. 2 pages.
Jaussi et al., "A 20Gb/s Embedded Clock Transceiver in 90nm CMOS," 18.8, ISSCC 2006 Session 18. 10 pages.
Kratyuk et al., "Frequency Detector for Fast Frequency Lock of Digital PLLs," Electronic Letters, vol. 43, No. 1, pp. 13-14, Jan. 4, 2007. 2 pages.
Lai et al., "Capturing Oscillator Injection Locking Via Nonlinear Phase-Domain Macromodels," IEEE Transactions on Microwave Theory and Techniques, vol. 52, No. 9, Sep. 2004, pp. 2251-2261. 11 pages.

Lee et al., "Paper 5.2: Subharmonically Injection-Locked PLLs for Ultra-Low-Noise Clock Generation," Slides, 2009 IEEE International Solid-State Circuits Conference. 32 pages.
Lee et al., "Subharmonically Injection-Locked PLLs for Ultra-Low-Noise Clock Generation," ISSCC 2009, Session 5, 5.2, pp. 91-93. 3 pages.
Maffezzoni, Paolo, "Analysis of Oscillator Injection Locking Through Phase-Domain Impulse-Response," IEEE Transactions on Circuits and Systems-I: Regular Papers, vol. 55, No. 5, Jun. 2008, pp. 1297-1305. 9 pages.
O'Mahony et al., "A 27Gb/s Forwarded-Clock I/O Receiver Using an Injection-Locked LC-DCO in 45nm CMOS," 25.1, ISSCC 2008 Session 25, pp. 452-453, 627. 3 pages.
Mirzaei et al., "Multi-Phase Injection Widens Lock Range of Ring-Oscillator-Based Frequency Dividers," IEEE Journal of Solid-State Circuits, vol. 43, No. 3, Mar. 2008, pp. 656-671. 16 pages.
Ng et al., "A Second-Order Semidigital Clock Recovery Circuit Based on Injection Locking," IEEE Journal of Solid-State Circuits, vol. 38 No. 12, Dec. 2003, pp. 2101-2110, plus corresponding ISSCC 2003 Session 4 paper 4.3. 18 pages.
O'Mahony et al., "A Programmable Phase Rotator based on Time-Modulated Injection-Locking," 2010 IEEE Symposium on VLSI Circuits (VLSIC), Honolulu, HI, Jun. 16-18, 2010, pp. 45-46. 2 pages.
O'Mahony et al., "Paper 25.1: A 27Gb/s Forwarded-Clock I/O Receiver using an Injection-Locked LC-DCO in 45nm CMOS," IEEE International Solid-State Circuits 2008. 39 pages.
Paciorek, L.J., "Injection Locking of Oscillators," Nov. 1965, Proceedings of the IEEE, vol. 53, No. 11, pp. 1723-1728. 6 pages.
PCT International Preliminary Report on Patentability (Chapter I) dated Jul. 23, 2015 in International Application No. PCT/US2014/010204. 6 pages.
PCT International Preliminary Report on Patentability dated Jan. 16, 2014 (Chapter I) in International Application No. PCT/US2012/039268. 12 pages.
PCT International Search Report and Written Opinion dated Dec. 20, 2012 in International Application No. PCT/US2012/039268. 15 pages.
PCT International Search Report and Written Opinion dated May 6, 2014 in International Application No. PCT/US2014/010204. 12 pages.
Rategh et al., "Superharmonic Injection-Locked Frequency Dividers," IEEE Journal of Solid-State Circuits, vol. 34, No. 6, pp. 813-821, Jun. 1999. 9 pages.
Razavi, Behzad, "A Study of Injection Locking and Pulling in Oscillators," IEEE Journal of Solid-State Circuits, vol. 39, No. 9, Sep. 2004, pp. 1415-1424. 10 pages.
Shekhar et al., "Strong Injection Locking in Low-Q LC Oscillators: Modeling and Application in a Forwarded-Clock I/O receiver," IEEE Transactions on Circuits and Systems-I: Regular Papers, vol. 56, No. 8, Aug. 2009, pp. 1818-1829. 12 pages.
Vanassche et al., "On the Difference between Two Widely Publicized Methods for Analyzing Oscillator Phase Behavior," 2002, IEEE, pp. 229-233. 5 pages.
Zhang et al., "Injection-Locked Clocking: A New GHz Clock Distribution Scheme," IEEE 2006 Custom Integrated Circuits Conference (CICC), pp. 785-788. 4 pages.
EP Extended European Search Report dated Oct. 18, 2016 re: EP Appln No. 14737836.8. 7 Pages.
EP Response dated Feb. 13, 2017 in Response to the Extended European Search Report dated Oct. 18, 2016 and the Communication Pursuant to Rules 70(2) and 70a(2) EPC dated Nov. 7, 2016 RE: EP Appln. No. 14737836.8. 23 Pages.

* cited by examiner

US 9,735,792 B2

INTEGRATED CIRCUIT COMPRISING CIRCUITRY TO DETERMINE SETTINGS FOR AN INJECTION-LOCKED OSCILLATOR

BACKGROUND

This disclosure relates to electronic circuits. Some circuits are expected to be operated over a range of operating conditions. For example, circuits that are used in mobile devices may be expected to be operated over a range of supply voltages and temperatures. Changing the operating conditions can change the electrical characteristics of circuit elements in a circuit, which, in turn, can change the behavior of the circuit. It is desirable to design circuits that can continue to operate with sufficiently large margins across the manufactured variation space even when the operating conditions change.

DETAILED DESCRIPTION

An injection locked oscillator or ILO is an oscillator that is capable of locking onto a reference clock signal when the frequency of the reference clock signal (also referred to as the "reference clock frequency") is within the locking range of the ILO. When the ILO is locked, the output frequency of the ILO is substantially equal to the reference clock frequency (e.g., the frequencies are substantially equal when the frequencies are measured by counting the number of cycles over a sufficiently long period of time). An ILO can also be used for clock multiplication. In these applications, the ILO is usually referred to as a "multiplying ILO" or MILO for short. The output frequency of the MILO (when locked) is equal to an integral multiple of the reference clock frequency. This disclosure describes some embodiments in the context of an ILO. It will be apparent to a person having ordinary skill in the art that, if the reference clock frequency is desired to be multiplied, then an ILO can be replaced by a MILO in the embodiments disclosed herein (when an ILO is replaced with a MILO, the accompanying circuitry may also need to be changed, but these changes will also be apparent to one having ordinary skill in the art).

Figure 1:
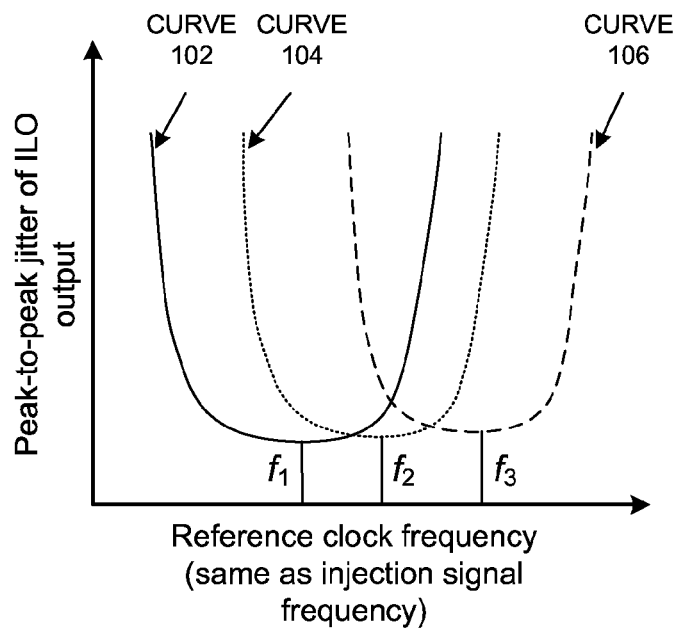
FIG. 1 illustrates a plot of the peak-to-peak jitter of an injection-locked oscillator (ILO) output signal versus the reference clock frequency under different operating conditions in accordance with some embodiments described in this disclosure.

FIG. 1 illustrates a plot of the peak-to-peak jitter of an ILO output signal versus the reference clock frequency under different operating conditions in accordance with some embodiments described in this disclosure. Curves 102-106 correspond to different operating conditions, e.g., different combinations of supply voltages and temperatures. For example, curve 102 can correspond to a low supply voltage and high temperature, curve 104 can correspond to a nominal supply voltage and nominal temperature, and curve 106 can correspond to a high supply voltage and low temperature.

A free running ILO (i.e., an ILO into which no injection signal is being injected) oscillates at its natural oscillation frequency. The natural oscillation frequency of the ILO can change when the operating conditions change. In FIG. 1, frequencies $f_1, f_2$, and $f_3$ correspond to the natural oscillation frequencies of the ILO for the different operating conditions that correspond to curves 102, 104, and 106, respectively.

As shown in curves 102-106, the peak-to-peak jitter of the ILO (or MILO) output signal is low when the reference clock frequency is substantially equal to the natural oscillation frequency of the ILO (or to an integral sub-multiple of the natural oscillation frequency of a MILO), and the peak-to-peak jitter of the ILO (or MILO) output signal increases as the reference clock frequency moves further away from the natural oscillation frequency of the ILO (or from the integral sub-multiple of the natural oscillation frequency of the MILO). The reason why the jitter increases as the reference clock frequency moves away from the natural oscillation frequency is because the reference clock injection forces the ILO or MILO away from its natural frequency and thus disturbs the oscillator's natural placement of the clock edges.

In some embodiments described herein, the natural oscillation frequency of the ILO may itself be modified by adjusting the delays of the delay elements in the ILO. Specifically, some embodiments include circuitry to quickly determine settings for the ILO that correspond to the natural oscillation frequency of the ILO being substantially equal to the reference clock frequency. In case of a MILO, the settings for the MILO correspond to the natural oscillation frequency of the MILO being substantially equal to an integral multiple of the reference clock frequency.

Figure 2A:
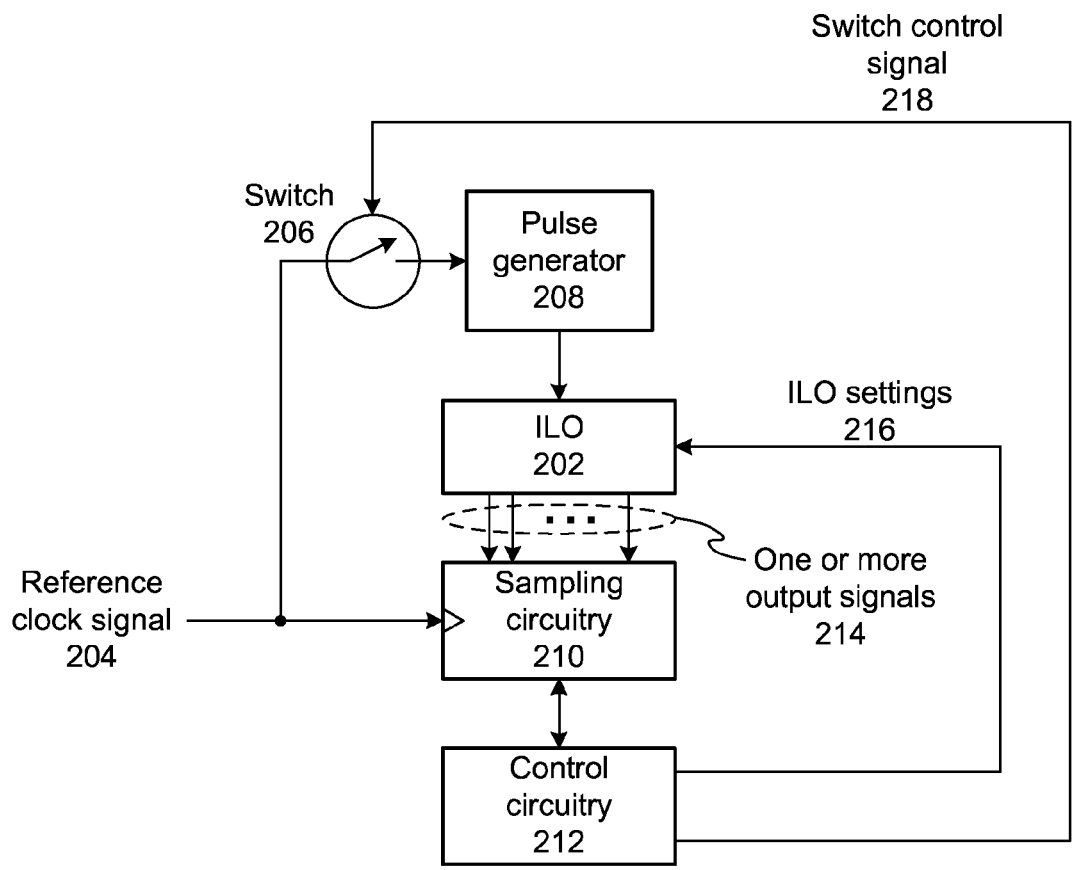
FIG. 2A illustrates circuitry that can be used to determine settings for an ILO in accordance with some embodiments described herein.

FIG. 2A illustrates circuitry that can be used to determine settings for an ILO in accordance with some embodiments described herein. Reference clock signal 204 is provided as an input to pulse generator 208 through switch 206. Switch 206 is controlled by switch control signal 218, which is generated by control circuitry 212. When switch 206 is open, the reference clock signal 204 is not passed into pulse generator 208, and when switch 206 is closed, the reference clock signal is allowed to pass into pulse generator 208.

The output of pulse generator 208 (when switch 206 is closed) is a sequence of one or more pulses that is clocked according to reference clock signal 204. The output of pulse generator 208 is inputted as an injection signal into ILO 202.

Specifically, the output of pulse generator 208 can be injected into one or more injection locations of ILO 202. When the output of pulse generator 208 is injected into multiple injection locations of ILO 202, each injection location of ILO 202 receives a delayed version (the delay can also be zero for one of the injection locations) of the output of pulse generator 208.

ILO 202 outputs one or more output signals 214. When switch 206 is closed, pulse generator 208 injects an injection signal into ILO 202, and one or more output signals 214 oscillate at the same frequency as the reference clock signal 204 (assuming that ILO 202 is locked onto reference clock signal 204). However, when switch 206 is open, pulse generator 208 does not inject any injection signals into ILO 202, and one or more output signals 214 oscillate at ILO 202's natural oscillation frequency.

The one or more output signals 214 are sampled by sampling circuitry 210 based on reference clock signal 204. Control circuitry 212 controls when sampling circuitry 210 samples one or more output signals 214. For example, control circuitry 212 can provide an enable signal to sampling circuitry 210, thereby causing sampling circuitry 210 to use reference clock signal 204 to sample the one or more output signals 214. The sampled values are then used by control circuitry 212 to determine ILO settings 216 for ILO 202. Specifically, control circuitry 212 can determine a delay-element setting for ILO 202 by using a logic block configured to compute a delay-element setting based on the sampled values or by performing a table lookup based on the sampled values. The ILO settings 216 can correspond to a delay-element setting that causes the natural oscillation frequency of ILO 202 to be substantially equal to the clock frequency of reference clock signal 204. ILO settings 216 can be provided to ILO 202 to change the delay of one or more delay elements in ILO 202. A benefit of changing the natural oscillation frequency of ILO 202 in this manner is that when the natural oscillation frequency of the oscillator is substantially equal to the reference clock frequency, the output jitter (i.e., the jitter in the output signal of ILO 202) is minimized and tolerance to voltage or temperature drift is maximized.

The following process can be used to change the natural oscillation frequency of ILO 202 so that the natural oscillation frequency of ILO 202 is substantially equal to the clock frequency of reference clock signal 204. Suppose switch 206 is currently closed, and an injection signal is injected into ILO 202, wherein the injection signal corresponds to a clock edge E of reference clock signal 204. Prior to the arrival of the next clock edge, control circuitry 212 opens switch 206 to prevent subsequent injection signals corresponding to subsequent clock edges (i.e., subsequent to clock edge E) of the reference clock signal 204 from being injected into ILO 202. When no injection signal is injected into ILO 202, ILO 202 runs freely, i.e., ILO 202 oscillates at its natural oscillation frequency. After a predetermined amount of time after clock edge E (e.g., after a certain number of clock edges after clock edge E), control circuitry 212 instructs sampling circuitry 210 to sample one or more output signals 214 using the timing of reference clock signal 204.

Note that during this mode the values of the sampled output signals depend on the difference between the natural oscillation frequency of ILO 202 and the clock frequency of reference clock signal 204, and that this is a relative measurement. Specifically, if the natural oscillation frequency of ILO 202 is not within a tolerance range around the clock frequency of reference clock signal 204, control circuitry 212 can use the sampled values to determine ILO settings 216 (or to determine a change, i.e., a "delta," in the existing ILO settings) that correspond to the ILO 202's natural oscillation frequency being substantially equal (or being within the tolerance range) to that of reference clock signal 204. Control circuitry 212 can then provide the determined ILO settings 216 to ILO 202, which can then adjust the delays of its delay elements so that ILO 202's natural oscillation frequency is substantially equal to that of reference clock signal 204 (or is within the tolerance range of the clock frequency of reference clock signal 204).

Figure 2B:
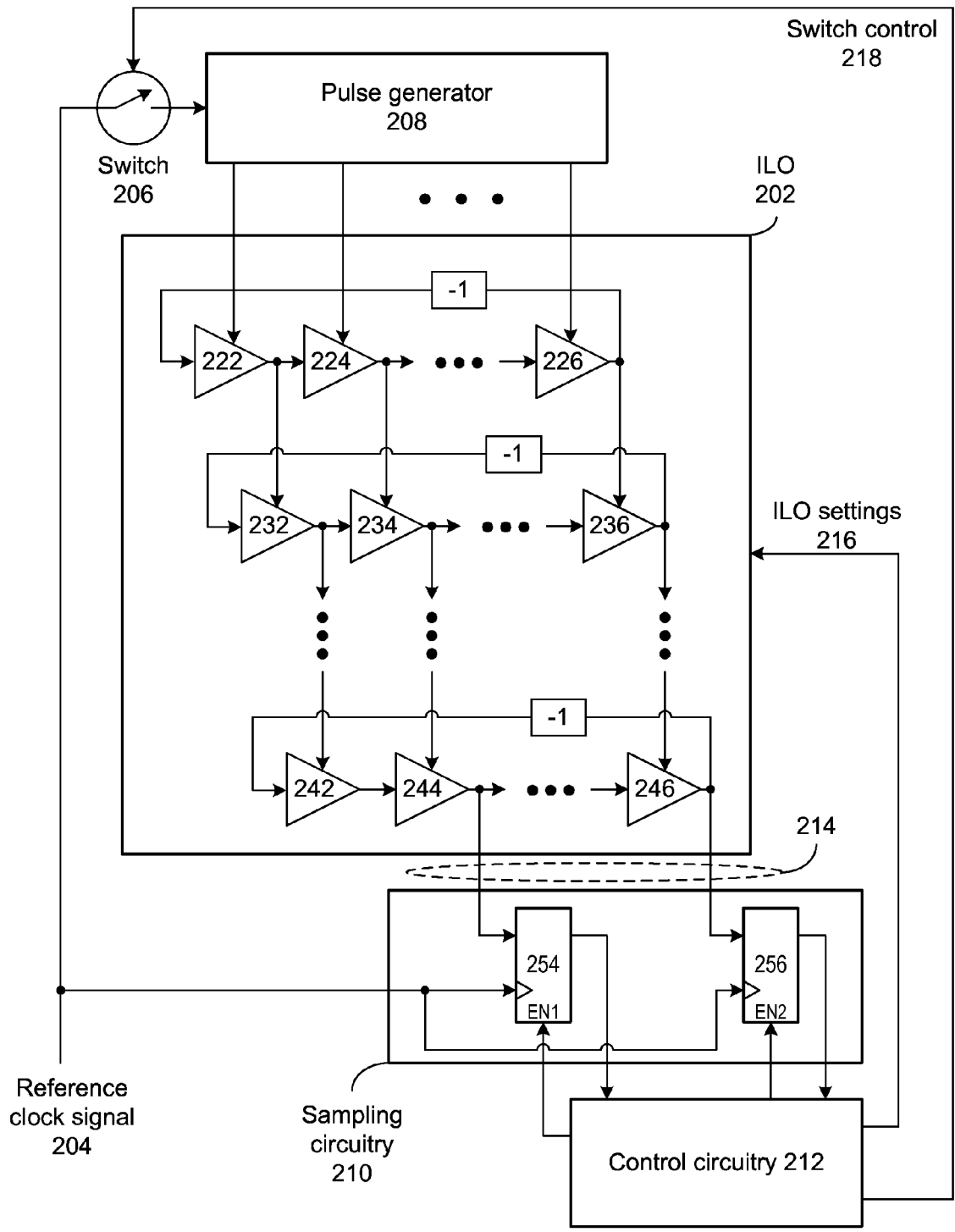
FIG. 2B illustrates an implementation of the circuitry shown in FIG. 2A in accordance with some embodiments described herein.

FIG. 2B illustrates an implementation of the circuitry shown in FIG. 2A in accordance with some embodiments described herein. A delay element in the loop of an ILO may or may not invert its input signal. However, the connection of delay elements to form an oscillatory loop requires an effective single inversion of the signal after the complete path. The fact that the loop inverts the signal is illustrated herein by using a rectangular box with a "−1" written inside the box. The rectangular box may not correspond to an actual circuit element. In some embodiments, the rectangular box with a "−1" written inside the box represents the fact that the loop has an odd number of single-ended delay elements that invert the signal. In some embodiments, the rectangular box with a "−1" written inside the box represents the fact that the differential outputs of an odd number of differential delay elements are provided, with reverse polarity, to the next differential delay element in the loop.

ILO 202 can be a single delay loop, or a cascaded-ILO structure as shown in FIG. 2B. Due to the jitter filtering nature of an ILO, the use of multiple, cascaded ILOs in succession as shown in FIG. 2B can result in significantly reduced output jitter when compared to the jitter in the output signal of a single ILO, even at the extreme of the locking range. In a cascaded-ILO structure, the outputs of the delay elements of each ILO are provided as injection signals (either as NRZ or pulse signals, depending on the requirements) to the corresponding delay elements in the next ILO. As stated earlier, such structures can be used for frequency multiplication ILOs (MILOs) as well. In the case of cascaded structures such as 202, the first stage can be a MILO followed by ILO filtering stages or multiple MILO stages can be used followed by ILO stages, or any combination thereof. In the multiplying embodiments, in general, the MILO stages are followed by ILO stages in order to provide the jitter filtering of the ILO stages to the final output clocks.

For example, as shown in FIG. 2B, the outputs of the delay elements 222-226 are provided as injection signals to corresponding delay elements 232-236, whose outputs are provided as injection signals to the corresponding delay elements of the next ILO, and so forth. The outputs of the delay elements 242-246 of the last ILO can be outputted as a set of substantially jitter-free oscillating clock signals with different phases that are locked onto reference clock signal 204 (i.e., assuming switch 206 remains closed and an injection signal based on reference clock signal 204 is continuously injected into ILO 202).

Outputs of one or more delay elements in ILO 202 can be provided as one or more output signals 214. In FIG. 2B, the one or more output signals 214 include the outputs of delay elements 244 and 246 in the last ILO. However, in general, the outputs of any set of one or more delay elements in ILO 202 can be provided as one or more output signals 214 to sampling circuitry 210. Note that the output signals of the delay elements in ILO 202 provide a fine phase resolution, thereby enabling control circuitry 212 to quickly (e.g., within a few clock cycles of reference clock signal 204) and accurately determine a difference in the frequencies of the ILO 202's natural oscillation frequency and the clock frequency of reference cock signal 204 (recall that reference clock signal 204 was used to generate both of the sampling signals that were used to sample the outputs of element 244 and element 246). The phase (and hence frequency difference) resolution can be proportional to the number of delay elements in a delay loop. Therefore, in general, an accurate difference in the ILO's natural oscillation frequency and the clock frequency of the reference clock signal can be detected more quickly if the delay loop has more delay elements.

Sampling circuitry 210 can generally include any circuitry that is capable of sampling one or more output signals 214 at one or more clock edges of reference clock signal 204. In the implementation shown in FIG. 2B, sampling circuitry 210 includes relatively high-bandwidth edge-triggered enabled flip-flops 254 and 256 that are clocked using reference clock signal 204, and which receive enable signals EN1 and EN2, respectively, from control circuitry 212. When control circuitry 212 provides enable signal EN1 to edge-triggered flip-flop 254, edge-triggered flip-flop 254 samples the output of delay element 244 at the next clock edge (positive and/or negative clock edge depending on the flip-flop) of reference clock signal 204. Likewise, when control circuitry 212 provides enable signal EN2 to edge-triggered flip-flop 256, edge-triggered flip-flop 256 samples the output of delay element 246 at the next clock edge (positive and/or negative clock edge depending on the flip-flop) of reference clock signal 204. Control circuitry 212 can then use the values sampled by edge-triggered flip-flops 254 and 256 to determine ILO settings 216.

Figure 2C:
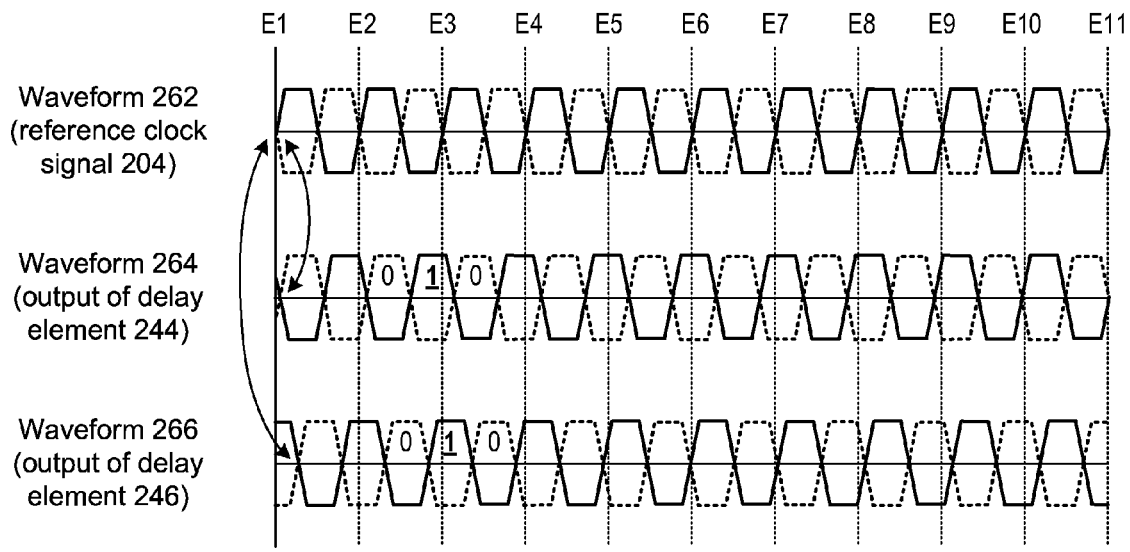
FIG. 2C illustrates some waveforms for the circuitry shown in FIG. 2B under a first operating condition in accordance with some embodiments described herein.

FIG. 2C illustrates some waveforms for the circuitry shown in FIG. 2B under a first operating condition in accordance with some embodiments described herein. Waveform 262 corresponds to reference clock signal 204, waveform 264 corresponds to the output of delay element 244, and waveform 266 corresponds to the output of delay element 246. The waveforms shown in FIG. 2C may be produced when the circuit shown in FIG. 2B is operated as follows. Control circuitry 212 allows (i.e., by keeping switch 206 closed) an injection signal corresponding to edge E1 to be injected into ILO 202. Note that a known phase delay exists between edge E1 and corresponding edges of the outputs of delay elements 244 and 246 (the correspondence between the edges is shown using double-sided arrows). After the injection signal corresponding to edge E1 is injected into ILO 202, control circuitry 212 opens switch 206 so that injection signals corresponding to edges E2-E11 are not injected into ILO 202. As shown in FIG. 2C, after edge E2 waveforms 264 and 266 correspond to ILO 202's natural oscillation frequency. The phase difference between waveform 264 and waveform 266 without injection (i.e., after edge E2) is representative of the delay between the output of element 244 and the output of element 246.

After opening switch 206, control circuitry 212 waits for a predetermined amount of time for ILO 202 to settle to its natural oscillating frequency and then provides an enable signal to edge-triggered flip-flops 254 and 256. In FIG. 2C, it is assumed that ILO 202 settles into its natural oscillation frequency in about one clock cycle. However, depending on various factors (e.g., how the injection signal is injected into the ILO, the difference between the reference clock frequency and the natural oscillation frequency, etc.), an ILO may require more time to settle into its natural oscillation frequency. In the example shown in FIG. 2C, control circuitry 212 provides the enable signal to edge-triggered flip-flops 254 and 256 prior to edge E3, thereby causing edge-triggered flip-flops 254 and 256 to sample the outputs of delay elements 244 and 246, respectively, at edge E3 (based off of reference clock 204). After edge E3, control circuitry 212 can instruct edge-triggered flip-flops 254 and 256 to continue to hold the sampled values. After edge E2 or E3, control circuitry 212 can also close switch 206 (this is not illustrated in FIG. 2C) in order to begin injection into the ILO. In the example shown in FIG. 2C, the natural oscillation frequency of ILO 202 is shown to be slightly less than the clock frequency of reference clock signal 204. The sampled values corresponding to the outputs of delay elements 244 and 246 are "1" and "1," respectively (the sampled values are shown bold and underlined). In this example, control circuitry 212 may determine that ILO 202's natural oscillation frequency is within the tolerance range, and no corrective action (e.g., no adjustment to ILO settings) needs to be taken. In alternate embodiments, the relative measurement can be taken an integer count away from the initial reference edge, e.g., reference clock E3 triggering a measurement of the difference between waveform 264 edge E4 and waveform 266 at edge E5.

Figure 2D:
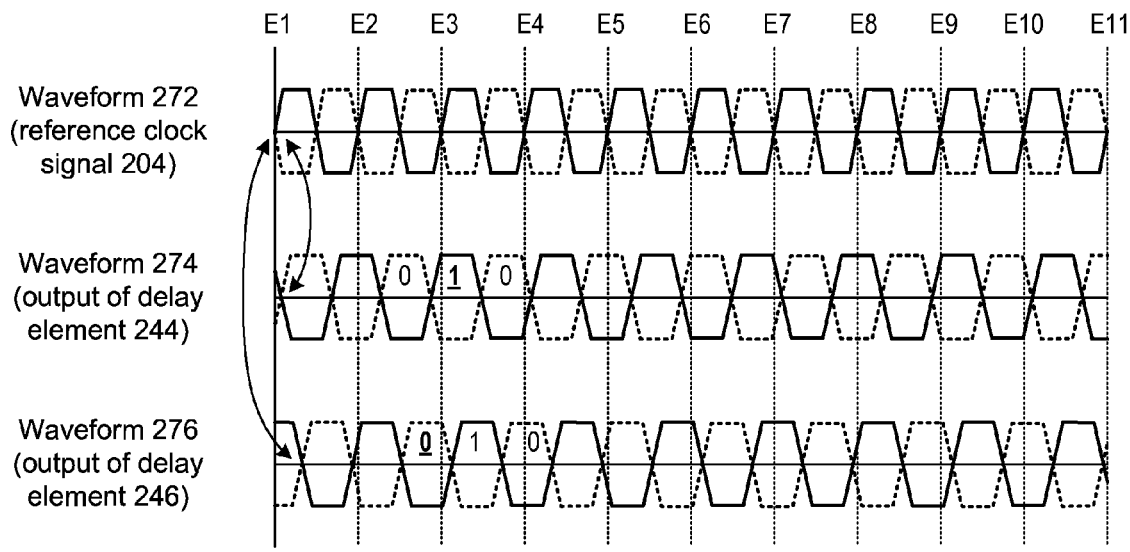
FIG. 2D illustrates some waveforms for the circuitry shown in FIG. 2B under a second operating condition in accordance with some embodiments described herein.

FIG. 2D illustrates some waveforms for the circuitry shown in FIG. 2B under a second operating condition in accordance with some embodiments described herein. Waveform 272 corresponds to reference clock signal 204, waveform 274 corresponds to the output of delay element 244, and waveform 276 corresponds to the output of delay element 246. The waveforms shown in FIG. 2D may be produced when the circuit shown in FIG. 2B is operated as explained above in reference to FIG. 2C. The difference between FIGS. 2C and 2D is that ILO 202's natural oscillation frequency in FIG. 2D is less than ILO 202's natural oscillation frequency in FIG. 2C (and therefore the difference between ILO 202's natural oscillation frequency and the clock frequency of reference clock signal 204 is greater in FIG. 2D than it is in FIG. 2C). Note that the sampled values corresponding to the outputs of delay elements 244 and 246 are "0" and "1," respectively, which is different from the sampled values in FIG. 2C. In FIG. 2D, control circuitry 212 may determine that ILO 202's natural oscillation frequency has moved outside a tolerance range (e.g., due to a change in the operating conditions). Therefore, in the example shown in FIG. 2D, control circuitry 212 may provide ILO settings 216 to ILO 202 to increase the natural oscillation frequency (e.g., by decreasing the delay of one or more delay elements). For example, control circuitry 212 can include a table that associates the value "01" (i.e., the concatenation of the sampled values of delay elements 244 and 246) with a delay-element setting that decreases the delay of one or more delay elements by an appropriate amount. Control circuitry 212 can perform a table lookup based on the value "01" and provide the resulting delay-element setting (which is shown as ILO settings 216 in this example) to ILO 202.

It is important to understand that, in both cases, the reference clock frequency in the form of signal 204 is used to measure the delay from the output of stage 244 to the output of stage 246, thus providing an indication of the relative difference between the reference clock frequency and the natural delay of a set of the delay elements of the ILO.

Figure 3A:
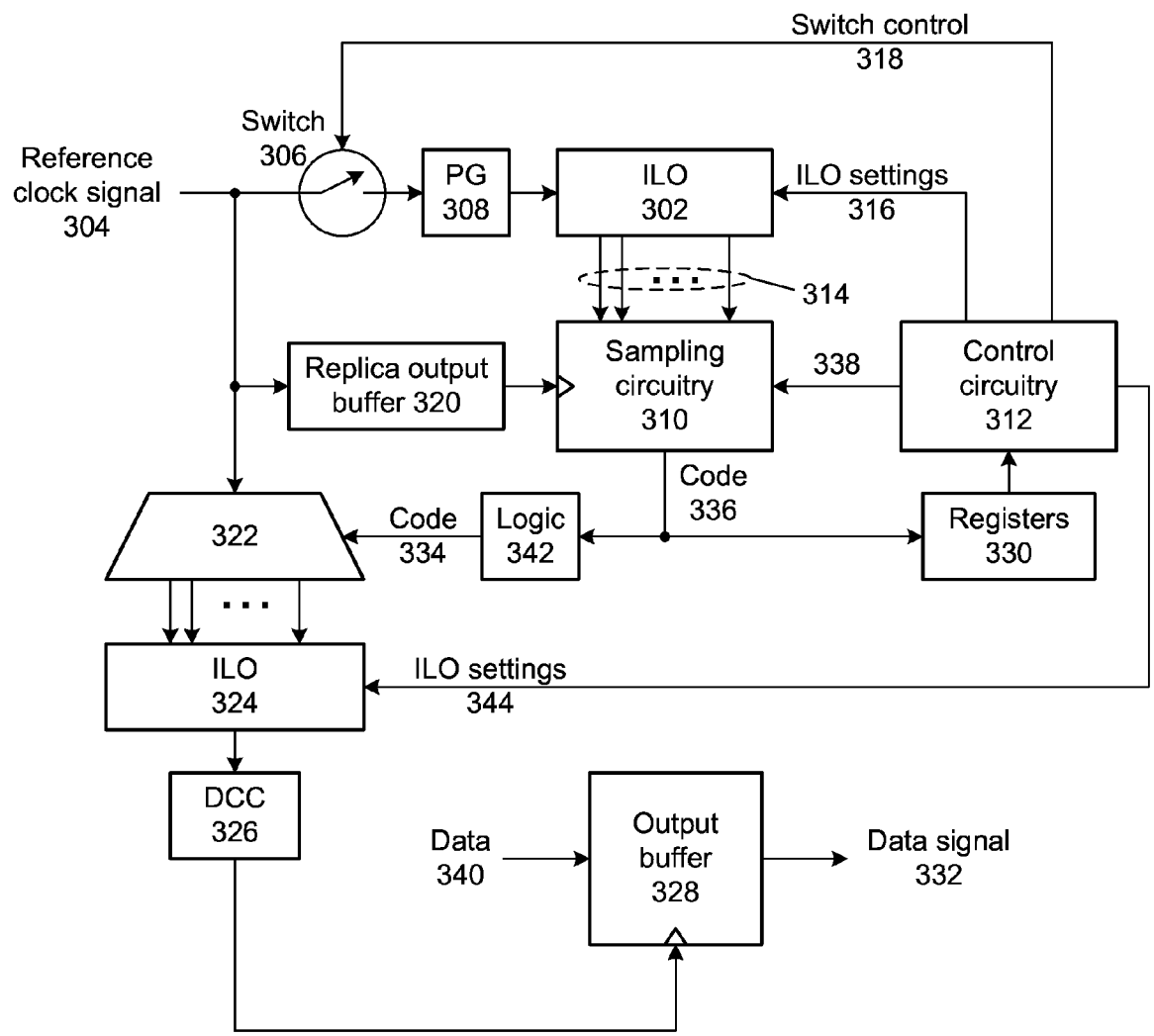
FIG. 3A illustrates how circuitry in a delay-locked loop (DLL) can be reused to determine settings for an ILO in the DLL in accordance with some embodiments described herein.

FIG. 3A illustrates how circuitry in an ILO-based DLL can be reused to determine settings for the ILO in accordance with some embodiments described herein. Reference clock signal 304 is provided as an input to pulse generator 308 through switch 306. Switch 306 is controlled by switch control signal 318, which is generated by control circuitry 312. When switch 306 is open, the reference clock signal 304 is not passed into pulse generator 308 and so pulse generator 308 does not generate pulses which affect the frequency of ILO 302. When switch 306 is closed, the reference clock signal 304 is passed into pulse generator 308, which generates pulses that cause ILO 302 to lock (assuming that reference clock signal 304 is within the locking range) onto reference clock signal 304.

The output of pulse generator 308 is a sequence of one or more pulses that are generated according to reference clock signal 304. The output of pulse generator 308 is inputted as an injection signal into ILO 302. Specifically, in some embodiments described herein, the output of pulse generator 308 is injected into one or more injection locations of ILO 302. When the output of pulse generator 208 is injected into multiple injection locations of ILO 302, each subsequent injection location receives a delayed version (the delay can also be zero for an injection location) of the output of pulse generator 308.

ILO 302 outputs one or more output signals 314. When switch 306 is closed, pulse generator 308 injects an injection signal into ILO 302, and one or more output signals 314 oscillate at substantially the same frequency as the reference clock signal 304 (assuming that ILO 302 is locked onto reference clock signal 304). However, when switch 306 is open, pulse generator 308 does not inject any injection signals into ILO 302, and one or more output signals 314 oscillate at ILO 302's natural oscillation frequency.

Replica output buffer 320 delays reference clock signal 304 to produce a delayed version of reference clock signal 304. The delay of replica output buffer 320 can be substantially equal to the delay of output buffer 328. The one or more output signals 314 from ILO 302 are sampled by sampling circuitry 310 based on a delayed version of reference clock signal 304 that is outputted by replica output buffer 320. Control circuitry 312 controls when sampling circuitry 310 sample ILO 302's output signal. For example, control circuitry 312 can provide a control signal 338 (e.g., an enable signal or a phase-capture request) to sampling circuitry 310, thereby causing sampling circuitry 310 to sample the one or more output signals 314.

In some embodiments described herein, sampling circuitry 310 includes a time-to-digital converter (TDC) that outputs code 336. According to one definition, a TDC includes circuitry that receives a sampling clock signal, and delayed versions of a second clock signal. The TDC then outputs a code that corresponds to a phase delay between the two clock signals (e.g., the phase delay of the second clock signal with respect to the sampling clock signal). In some embodiments described herein, the TDC outputs a code at each positive and/or negative edge of the sampling clock signal. In alternate embodiments, the TDC can issue a single sample, or multiple samples in accordance with a phase-capture request. In some embodiments the TDC code will represent a number of stages inside ILO 302 between clock edges of reference clock signal 304.

Code 336 can be provided to logic block 342, which outputs code 334 based on code 336. Logic block 342 includes circuitry to reduce the sensitivity to jitter in reference clock signal 304 and/or to reduce tracking bandwidth. In some embodiments described herein, logic block 342 can accomplish this by (a) by averaging multiple codes 336, or building a majority-detector from the incoming phase-stream) to produce an "up/down" or "early/late" indicator, which is then used to incrementally adjust the previously determined value of code 334, (b) limit the extent of the phase jump from the previously determined value of code 334, and/or (c) turn off triggered relock and only track at a reduce update rate.

Reference clock signal 304 is provided as an input to de-multiplexer/de-blender 322. In some embodiments described herein, reference clock signal 304 can be provided as an input to a pulse generator, and the output of the pulse generator can be provided as an input to de-multiplexer/de-blender 322. According to one definition, the term "de-multiplexer/de-blender" generally refers to circuitry that is capable of outputting a received input signal on an individual selected output and/or outputting the received input signal with different weights (e.g., different amplitudes) on two or more selected outputs. De-multiplexer/de-blender 322 can select the output(s) from the set of outputs (and optionally determine the weight associated with each selected output) based on code 334.

The outputs of de-multiplexer/de-blender 322 are injected into corresponding injection locations of ILO 324. For example, each output of de-multiplexer/de-blender 322 can be injected into a corresponding delay element of ILO 324. The phase delay between reference clock signal 304 and the output of ILO 324 depends on the output(s) of de-multiplexer/de-blender 322 and optionally the weights that were selected based on code 334. The output of ILO 324 may contain adjacent pulses with different widths (e.g., due to deterministic jitter). Duty cycle corrector DCC 326 can be used to remove deterministic jitter due to duty-cycle distortion from the output of ILO 324 by adjusting the average odd vs. even pulse widths. When present, DCC 326 outputs a clock signal whose even-pulse widths and odd-pulse widths are substantially equal and constant. The output of DCC 326 can then be provided as a clock input to output buffer 328, which outputs data signal 332 based on data 340. If the output of ILO 324 has a negligible amount of jitter, the output of ILO 324 may be directly provided as the clock input to output buffer 328.

Since the output of replica output buffer 320 is used as the sampling clock signal by sampling circuitry 310, code 336 (and therefore code 334) corresponds to a phase delay of "1−d," where "d" is the phase delay of output buffer 328 (which is equal to the phase delay of replica output buffer 320). The phase delay of "1−d" is then added to reference clock signal 304 by the combination of de-multiplexer/de-blender 322 and ILO 324. Finally, when output buffer 328 outputs data signal 322, it adds a phase delay of "d" which cancels out the phase delay of "1−d" that was added by the combination of de-multiplexer/de-blender 322 and ILO 324. In this manner, the circuitry shown in FIG. 3A is able to perform clock de-skewing by canceling out the phase delay introduced by output buffer 328.

As explained above, the output signals of ILOs 302 and 324 have low jitter if their natural oscillation frequencies are substantially equal to the frequency of reference clock signal 304. The circuitry shown in FIG. 3A can reuse the DLL circuitry (e.g., sampling circuitry 310) to adjust the natural oscillation frequencies of ILO 302 and 324 as follows. Two or more codes 336 outputted by sampling circuitry 310 can be stored in registers 330. The codes stored in registers 330 can then be used by control circuitry 312 to determine ILO settings 316 for ILO 302 and ILO settings 344 for ILO 324. In some embodiments described herein, ILO settings 316 correspond to a natural oscillation frequency of ILO 302 which is substantially equal to the clock frequency of reference clock signal 304, and ILO settings 344 correspond to the natural oscillation frequency of ILO 324 being substantially equal to the clock frequency of reference clock signal 304. In some embodiments, ILO settings 316 are used by ILO 302 to change the delay of one or more delay elements in ILO 302, and ILO settings 344 are used by ILO 324 to change the delay of one or more delay elements in ILO 324.

Note that code 336 corresponds to a phase difference between a delayed version of reference clock signal 304 (i.e., the output of replica output buffer 320) and one of the outputs of ILO 302. If this phase difference remains substantially constant over time (i.e., if the values of code 336 stored in registers 330 are substantially the same for multiple samples after ILO 302 is allowed to settle into a natural oscillation state), then that indicates that the natural oscillation frequency of ILO 302 is substantially equal to the frequency of reference clock signal 304. On the other hand, if the phase difference increase or decreases over time (i.e., if the consecutive values of code 336 stored in registers 330 show an increasing or decreasing trend), then that indicates that the natural oscillation frequency of ILO 302 is different from the frequency of reference clock signal 304, and the rate of increase or decrease in the values of code 336 corresponds to the frequency difference. In some embodiments described herein, control circuitry 312 can determine ILO settings 316 and 344 based on the rate of increase or decrease in the values of code 336. Specifically, if registers 330 stores two code values, then control circuitry 312 can determine ILO settings 316 and 344 based on the difference between the two code values that would be required in order to move the natural operating frequency of ILO 302 and ILO 324 substantially close to that of reference clock 304. If registers 330 stores more than two code values, then control circuitry 312 can compute an average of the differences between consecutive code values, and use the average difference to determine ILO settings 316 and 344.

Figure 3B:
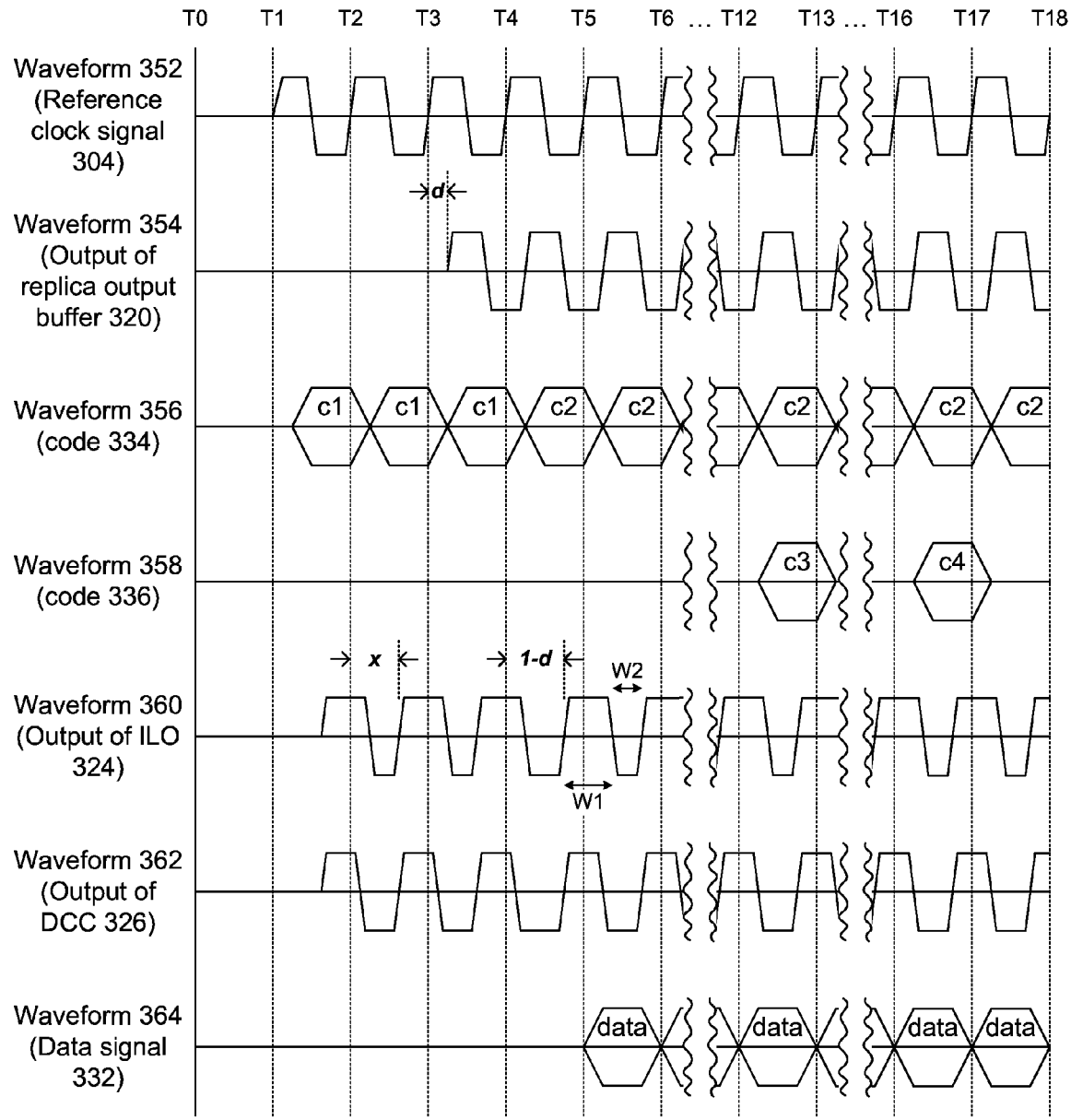
FIG. 3B illustrates some waveforms for the circuitry shown in FIG. 3A in accordance with some embodiments described herein.

FIG. 3B illustrates some waveforms for the circuitry shown in FIG. 3A in accordance with some embodiments described herein. Waveform 352 corresponds to reference clock signal 304, waveform 354 corresponds to the output of replica output buffer 320, waveform 356 corresponds to code 334, waveform 358 corresponds to code 336, waveform 360 corresponds to the output of ILO 324, waveform 362 corresponds to the output of DCC 326, and waveform 364 corresponds to data signal 332.

Waveform 354 has a phase delay with respect to waveform 352. This phase delay can be substantially equal to the phase delay of replica output buffer 320 (which is equal to the phase delay introduced by output buffer 328). Waveform 356 shows code 334 that is generated by logic block 342. When reference clock signal 304 is turned on at time T1, logic block 342 outputs the code "c1." Code "c1" can be a previously stored code, a default code, or a code that indicates that the delay-locked loop has not yet locked. Code "c1" may correspond to phase delay "x" which is shown in waveform 360. After a predetermined number of reference clock cycles, sampling circuitry 310 again samples ILO 302 and then logic block 342 outputs code "c2" which is different from code "c1." The circuitry shown in FIG. 3A uses code "c2" to apply a delay to reference clock signal 304 as shown in waveform 360. Note that waveform 360 has deterministic jitter. Specifically, each clock cycle in waveform 360 comprises two pulse widths: a wide pulse of width W1 and a narrow pulse of width W2. Waveform 362 corresponds to the output of DCC 326 in which the deterministic jitter has been substantially reduced. The output of DCC 326 (i.e., waveform 362) can then be provided as a clock signal to output buffer 328. As shown in waveform 364, clock edges of data signal 332 have substantially zero phase delay with respect to the clock edges of reference clock signal 304 because the phase delay "d" added by output buffer 328 has canceled out the phase delay "1−d" that was added by de-multiplexer/de-blender 322 and ILO 324.

Waveform 358 illustrates the code 336 generated by sampling circuitry 310. From time T0-T6, switch 306 is closed, and code "c2" is outputted when ILO 302 locks onto reference clock signal 304. Code "c2" is then used, as explained above, to cancel the phase delay introduced by output buffer 328. At time T6, control circuitry 312 opens switch 306, thereby allowing ILO 302 to oscillate at its natural oscillation frequency. After a predetermined amount of time has passed to allow ILO 302 to settle into its natural oscillation frequency, control circuitry 312 instructs sampling circuitry 310 to generate another code (e.g., at time T12), which is shown as "c3" in waveform 358. Then, after yet another predetermined amount of time to allow ILO 302's phase to drift away by a sufficient amount, control circuitry 312 instructs sampling circuitry 310 to generate yet another code (e.g., at time T16), which is shown as "c4" in waveform 358. Codes "c3" and "c4" can be stored in registers 330. Control circuitry 312 then determines ILO settings 316 and 344 based on codes "c3" and "c4." The difference between the values of codes "c3" and "c4" show the different relative phase positions of the natural frequency edges as sampled by the reference clock. A small difference would indicate that the natural frequency is close to the reference clock frequency. Conversely, a large difference would indicate that the natural frequency is far from the reference clock frequency.

Figure 4:
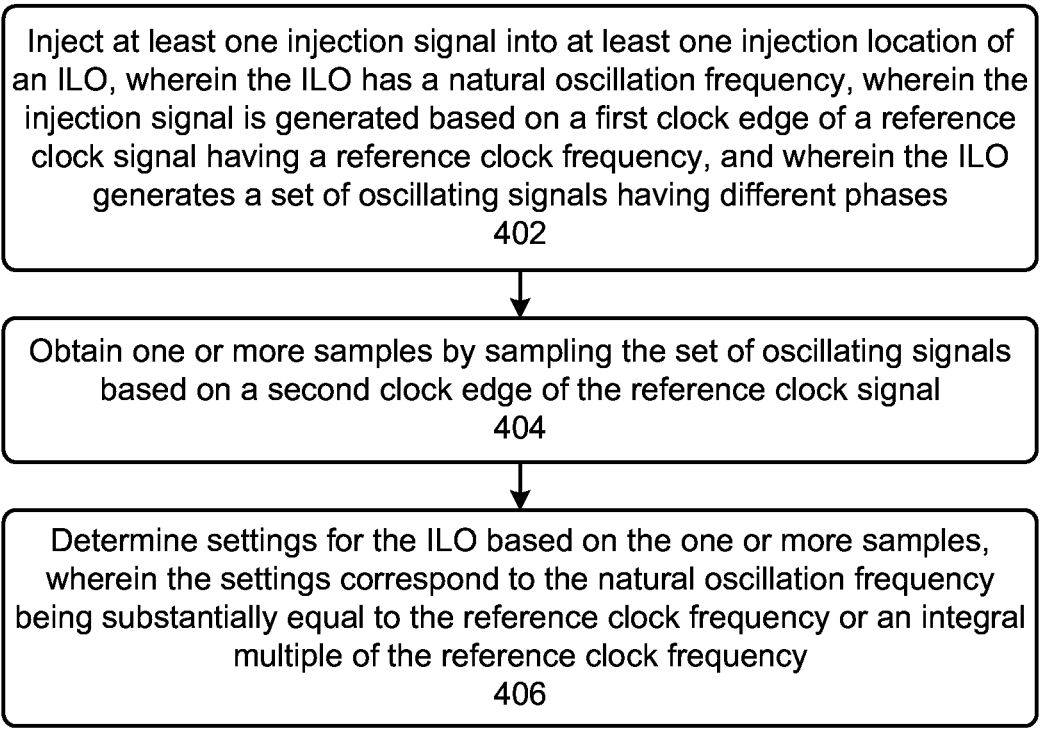
FIG. 4 presents a flow chart that illustrates a process that can be performed by the circuitries shown in FIGS. 2A-2B for determining settings for an ILO in accordance with some embodiments described herein.

FIG. 4 presents a flow chart that illustrates a process that can be performed by the circuitry shown in FIGS. 2A and/or 2B for determining settings for an ILO in accordance with some embodiments described herein. The process begins with injecting at least one injection signal into at least one injection location of an ILO, wherein the ILO has a natural oscillation frequency, wherein the injection signal is generated based on a first clock edge of a reference clock signal having a reference clock frequency, and wherein the ILO generates a set of oscillating signals having different phases (operation 402). Injection signals corresponding to clock edges between the first clock edge and a second clock edge of the reference clock signal are not injected into the ILO to allow the ILO to run freely at its natural oscillation frequency. Next, one or more samples can be obtained by sampling the set of oscillating signals based on the second clock edge of the reference clock signal (operation 404). After obtaining the one or more samples, the injection signal can optionally be resumed.

Settings for the ILO can then be determined based on the one or more samples, wherein the settings correspond to the natural oscillation frequency being substantially equal to the reference clock frequency or an integral multiple of the reference clock frequency (operation 406). In some embodiments described herein, a delay-element setting for the ILO can be determined by performing a table lookup based on the one or more samples.

In some embodiments described herein, the ILO is part of a DLL. In some embodiments described herein, the process illustrated in FIG. 4 is performed when one or more of the following events occur: an initial power-on sequence, a clock drift in the reference clock signal is greater than a threshold, a change in a temperature value is greater than a threshold, a change in a supply voltage value is greater than a threshold, or a predetermined amount of time has passed since the last calibration (e.g., the process can be performed at regular intervals).

Figure 5:
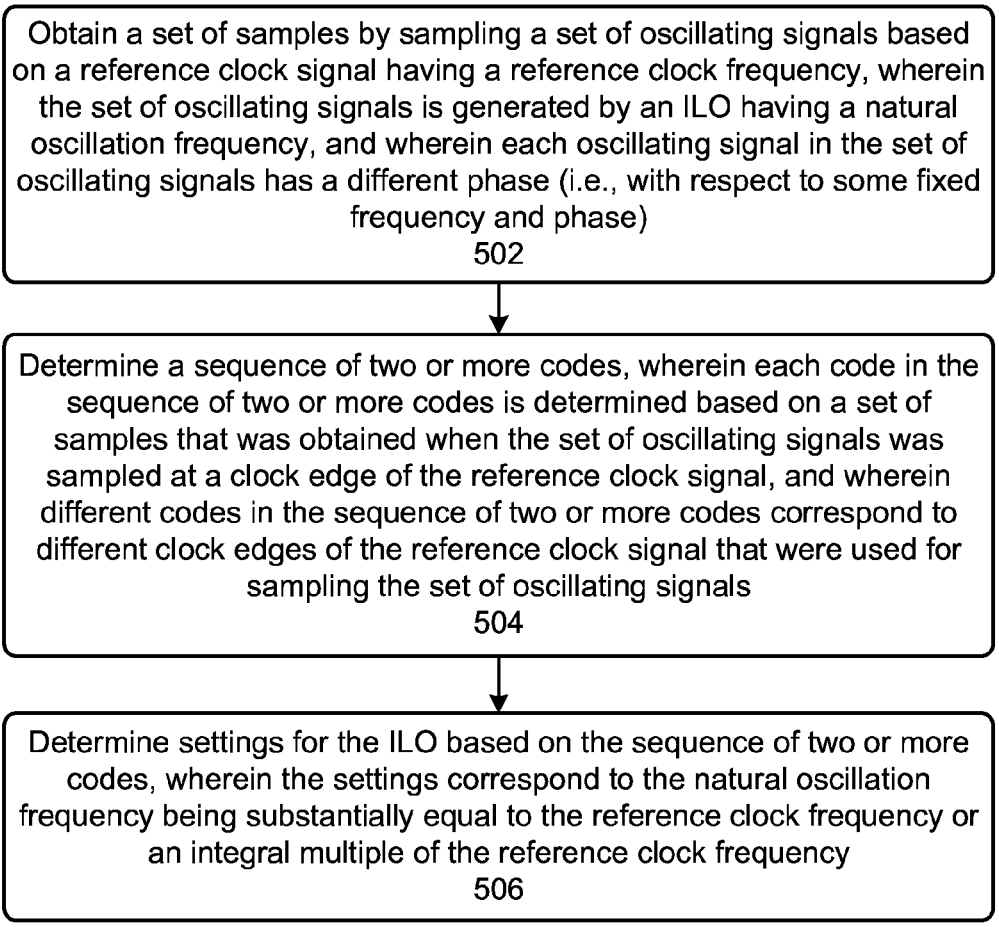
FIG. 5 presents a flow chart that illustrates a process that can be performed by the circuitry shown in FIG. 3A for determining settings for an ILO in accordance with some embodiments described herein.

FIG. 5 presents a flow chart that illustrates a process that can be performed by the circuitry shown in FIG. 3A for determining settings for an ILO in accordance with some embodiments described herein. The process begins with obtaining a set of samples by sampling a set of oscillating signals based on a reference clock signal having a reference clock frequency, wherein the set of oscillating signals is generated by an ILO having a natural oscillation frequency, and wherein each oscillating signal in the set of oscillating signals has a different phase (i.e., with respect to some fixed frequency and phase) (operation 502).

Next, a sequence of two or more codes can be determined, wherein each code in the sequence of two or more codes is determined based on a set of samples that was obtained when the set of oscillating signals was sampled at a clock edge of the reference clock signal, and wherein different codes in the sequence of two or more codes correspond to different clock edges of the reference clock signal that were used for sampling the set of oscillating signals (operation 504). Note that the injection signal to the ILO is switched off (e.g., by opening switch 306) and the ILO is allowed to settle into its natural oscillation state before the samples are obtained.

Settings for the ILO can then be determined based on the sequence of two or more codes, wherein the settings correspond to the natural oscillation frequency being substantially equal to the reference clock frequency or an integral multiple of the reference clock frequency (operation 506). Specifically, in some embodiments, the ILO settings are determined based on the difference between two codes in the sequence of two or more codes and on the current settings of the ILO. In some embodiments, a delay-element setting for the ILO can be determined by performing a table lookup based on a value (e.g., an average difference) computed using the sequence of two or more codes.

In some embodiments described herein, the ILO is part of a DLL, and wherein the process illustrated in FIG. 5 is performed by reusing DLL circuitry after the DLL achieves a phase lock on the reference clock signal. In some embodiments described herein, the process illustrated in FIG. 5 is performed when one or more of the following events occur: an initial power-up sequence, a clock drift in the reference clock signal is greater than a threshold, a change in a temperature value is greater than a threshold, and a change in a supply voltage value is greater than a threshold, or a predetermined amount of time has passed since the last calibration (e.g., the process can be performed at regular intervals).

Figure 6:
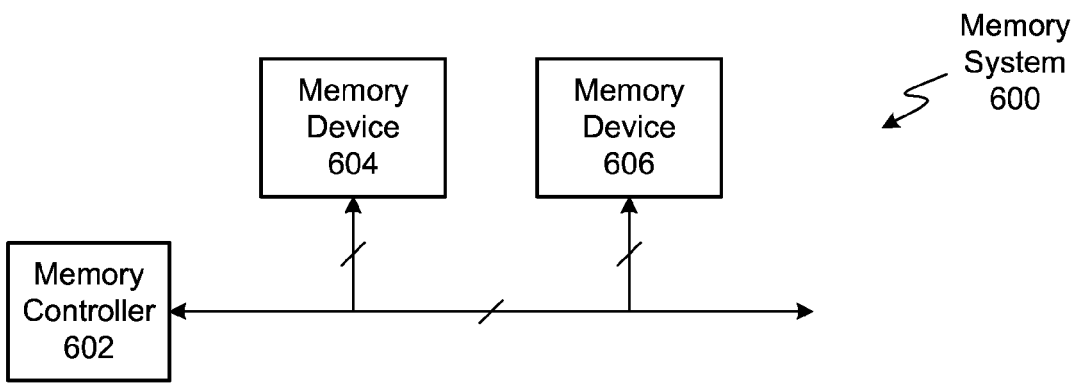
FIG. 6 illustrates a memory system in accordance with some embodiments described herein.

FIG. 6 illustrates a memory system in accordance with some embodiments described herein. In some embodiments described herein, a memory system includes a memory controller coupled to one or more memory devices via signal lines. For example, memory system 600 includes memory controller 602 coupled to memory devices 604 and 606 via signal lines. In some embodiments described herein, memory controller 602 provides one or more clock signals and one or more command/control signals to memory devices 604 and 606. Memory devices 604 and 606 provide one or more data signals to memory controller 602.

Examples of memory devices include dynamic random access memory (DRAM) devices such as synchronous double data rate (DDR) DRAM or non-volatile memory such as Flash memory. In some embodiments, memory controller 602 is an integrated circuit device having an interface that orchestrates data flow to and from a memory device. In various embodiments, memory controller 602 is disposed, along with one or more memory devices, on a circuit board, or may reside with the memory device in a common encapsulated package, or included in a stack configuration with the memory device (for example, in a package on package (PoP) configuration or using through silicon via (TSV) technology).

The methods and/or processes that have been implicitly or explicitly described in this disclosure can be embodied in hardware, software, or a combination thereof Hardware embodiments include, but are not limited to, IC chips, field-programmable gate arrays (FPGAs), system-on-chips (SoCs), application specific integrated circuits (ASICs), etc.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. An integrated circuit (IC), comprising:
an injection-locked oscillator (ILO) to generate a set of oscillating signals having different phases, wherein the ILO has a natural oscillation frequency;
first circuitry to inject at least one injection signal into at least one injection location of the ILO, wherein the injection signal is generated based on a first clock edge of a reference clock signal having a reference clock frequency;
second circuitry to obtain one or more samples by sampling the set of oscillating signals based on a second clock edge of the reference clock signal, wherein each sample represents a signal value of an oscillating signal in the set of oscillating signals at an instance of time that corresponds to the second clock edge; and
third circuitry to determine settings for the ILO based on the one or more samples, wherein the settings correspond to the natural oscillation frequency being substantially equal to the reference clock frequency or an integral multiple of the reference clock frequency.

2. The IC of claim 1, wherein the first circuitry is capable of injecting multiple delayed versions of the injection signal at multiple injection locations of the ILO.

3. The IC of claim 1, wherein after injecting the injection signal corresponding to the first clock edge of the reference clock signal, the first circuitry is capable of preventing subsequent injection signals corresponding to subsequent clock edges of the reference clock signal from being injected into the ILO.

4. The IC of claim 1, wherein the ILO includes a set of delay stages, and wherein the set of oscillating signals correspond to output signals of at least a subset of the set of delay stages.

5. The IC of claim 4, wherein the second circuitry includes at least two edge-triggered flip-flops, wherein outputs of at least two different delay stages are coupled to inputs of the at least two edge-triggered flip-flops.

6. The IC of claim 5, wherein the third circuitry includes logic to determine a delay-element setting by performing a table lookup based on values stored in the at least two edge-triggered flip-flops.

7. An integrated circuit (IC), comprising:
an injection-locked oscillator (ILO) to generate a set of oscillating signals having different phases, wherein the ILO has a natural oscillation frequency;
first circuitry to obtain a set of samples by sampling the set of oscillating signals based on a reference clock signal having a reference clock frequency, wherein each sample represents a signal value of an oscillating signal in the set of oscillating signals at an instance of time that corresponds to a second clock edge;
second circuitry to determine a sequence of two or more codes, wherein each code in the sequence of two or more codes is determined based on a set of samples that was obtained when the set of oscillating signals was sampled at a clock edge of the reference clock signal, and wherein different codes in the sequence of two or more codes correspond to different clock edges of the reference clock signal that were used for sampling the set of oscillating signals;
third circuitry to determine settings for the ILO based on the sequence of two or more codes, wherein the settings correspond to the natural oscillation frequency being substantially equal to the reference clock frequency or an integral multiple of the reference clock frequency.

8. The IC of claim 7, further comprising fourth circuitry to prevent an injection signal from being injected into the ILO.

9. The IC of claim 7, wherein the third circuitry includes fourth circuitry to determine a delay-element setting by performing a table lookup based on a value that is computed using the sequence of two or more codes.

10. The IC of claim 9, further comprising fifth circuitry to provide the delay-element setting to the ILO.

11. A method, comprising:
injecting at least one injection signal into at least one injection location of an injection locked oscillator (ILO) having a natural oscillation frequency, wherein the injection signal is generated based on a first clock edge of a reference clock signal having a reference clock frequency, and wherein the ILO generates a set of oscillating signals having different phases;
obtaining one or more samples by sampling the set of oscillating signals based on a second clock edge of the reference clock signal, wherein each sample represents a signal value of an oscillating signal in the set of oscillating signals at an instance of time that corresponds to the second clock edge; and
determining settings for the ILO based on the one or more samples, wherein the settings correspond to the natural oscillation frequency being substantially equal to the reference clock frequency or an integral multiple of the reference clock frequency.

12. The method of claim 11, wherein after injecting the injection signal corresponding to the first clock edge of the reference clock signal, the method further comprises preventing subsequent injection signals corresponding to subsequent clock edges of the reference clock signal from being injected into the ILO.

13. The method of claim 11, wherein said determining includes determining a delay-element setting by performing a table lookup based on the one or more samples.

14. The method of claim 11, wherein the method is performed when one or more of the following events occur:
a clock drift in the reference clock signal is greater than a threshold,
a change in a temperature value is greater than a threshold, and
a change in a supply voltage value is greater than a threshold.

* * * * *